United States Patent [19]

Fischer

[11] 4,199,894
[45] Apr. 29, 1980

[54] TOY MODEL KIT INCLUDING A SOLAR COLLECTOR

[76] Inventor: Artur Fischer, Weinhalde 34, D-7244 Waldachtal 3 (Tumlingen), Fed. Rep. of Germany

[21] Appl. No.: 923,640

[22] Filed: Jul. 10, 1978

[30] Foreign Application Priority Data

Aug. 19, 1977 [DE] Fed. Rep. of Germany ....... 2737443

[51] Int. Cl.² ...................... A63H 33/10; H01L 31/04
[52] U.S. Cl. ........................................... 46/17; 46/45; 46/26; 136/89 P; 136/89 AC
[58] Field of Search ............ 136/89 P, 89 EP, 89 AC; 46/26, 45, 16, 17

[56] References Cited

U.S. PATENT DOCUMENTS

| 4,009,054 | 2/1977 | Gochermann et al. ............ 136/89 P |
| 4,040,867 | 8/1977 | Forestieri et al. .................. 136/89 P |
| 4,104,083 | 8/1978 | Hirano ............................... 136/89 H |

FOREIGN PATENT DOCUMENTS

841259  6/1952  Fed. Rep. of Germany ..... 46/243 LV

*Primary Examiner*—Aaron Weisstuch
*Attorney, Agent, or Firm*—Michael J. Striker

[57] ABSTRACT

A solar collector, particularly as a power source for a toy model assembled from structural elements of a kit, has a supporting member, at least one solar cell mounted on the supporting member, mechanical connecting elements arranged on the supporting member for mechanically connecting the latter with another structural element of the toy model, and electrical connecting elements also arranged on the supporting member for electrically connecting the solar cell with other solar cells. The electrical connecting elements may connect the solar cells with one another in parallel and/or in series. The supporting member may be plate-like. The electrical connecting elements may be arranged on two opposite side faces of the supporting member and may include two pairs of plugs and/or sockets.

16 Claims, 1 Drawing Figure

U.S. Patent
Apr. 29, 1980
4,199,894
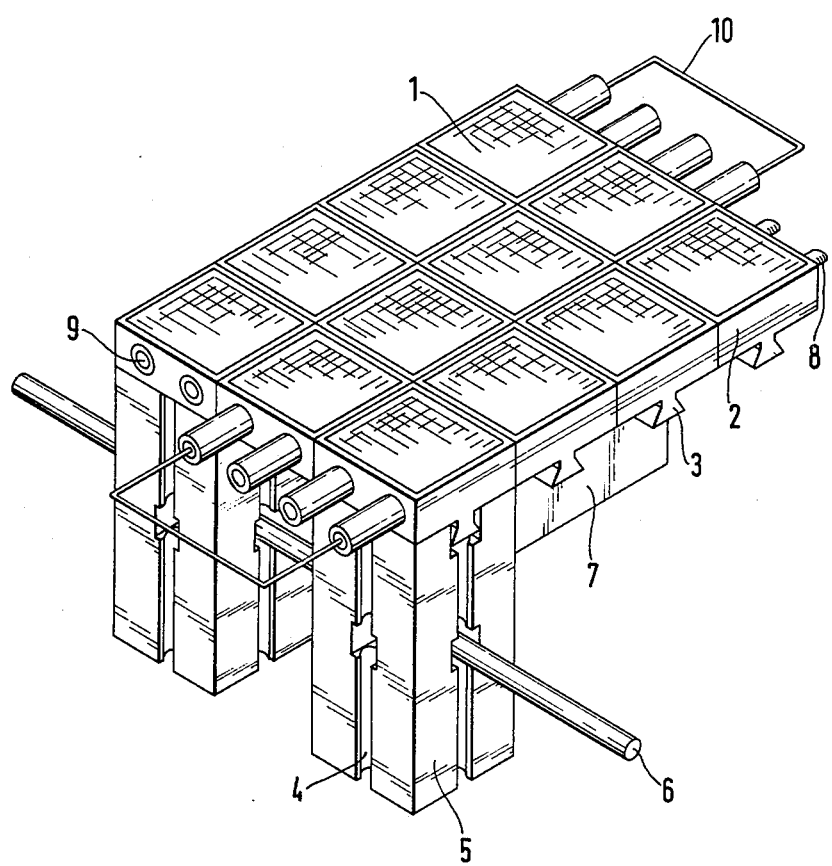

TOY MODEL KIT INCLUDING A SOLAR COLLECTOR

BACKGROUND OF THE INVENTION

The present invention relates to a solar collector, particularly as a power source for a toy model assembled from structural elements of a kit.

Solar collectors as power sources for toy models are known in the art. In known constructions, in order to provide a required power (or current) and voltage, solar cells are assembled in corresponding number in a plate-like housing and connected with one another by wires. Such solar collectors do not have direct relations to a particular toy model, and the plate-like housing is formed, as a rule, as a separate member connectable to a toy model. The thus-formed solar collector not only negatively affects the appearance of the toy models but also has a further disadvantage in that, it is necessary to drive (and move) not only the model but also the solar collector and its housing. Another disadvantage of such a solar collector is that changes of output (or current) and voltage of an assembly formed by the solar cells can be performed only by an expert with the aid of auxiliary devices, and cannot be performed by a playing child.

SUMMARY OF THE INVENTION

Accordingly, it is an object of the present invention to provide a solar collector, particularly as a power source for a toy model assembled from structural elements, which avoids the disadvantages of the prior art.

More particularly, it is an object of the present invention to provide a solar collector as a power source for a toy model assembled from structural elements, which solar collector forms a component part of the toy model itself and does not undesirably affect the appearance of the latter.

Another object of the present invention is to provide a solar collector as a power source of a toy model assembled of structural elements, whose output (or current) and voltage can be easily and simply changed by a playing child, if desired.

In keeping with these objects, and with others which will become apparent hereinafter one feature of the present invention resides, briefly stated, in a solar collector which has a supporting member, at least one solar cell mounted on the supporting member, mechanical connecting means arranged on the supporting member for mechanically connecting the latter with other structural elements of the toy model, and electrical connecting means also arranged on the supporting member for electrically connecting the solar cell with other solar cells. The electrical connecting means may connect the solar cells with one another in parallel and/or in series.

The thus-constructed solar collector may be directly utilized in assembling toy models and may serve, for example, as an outer cover element or a loading plate. Thereby, the solar collector forms a component part of a toy model which does not negatively affect the appearance and does not increase the weight of the toy model.

The required electric output and voltage of an assembly composed from a plurality of the solar cells are attained by assembling a corresponding number of the solar cells and electrically connecting the latter with one another by the electrical connecting means arranged on the supporting members.

In accordance with another feature of the present invention, the electrical connecting means include two pairs of electrical connecting elements provided on two opposite side faces of the supporting member. The electrical connecting elements may include plugs and/or sockets. In such a construction, electrical connection of the solar cells and simultaneous mechanical connection of the supporting members which support the solar cells are provided when the plugs of one of the supporting members are inserted into the sockets of another supporting member.

One electrical connecting element of each of the pairs forms a positive pole, whereas the other element of the same pair forms a negative pole. In order to increase the output of the assembly the solar cells may be electrically connected with one another in parallel by means of matching the identical poles arranged on the supporting members. In order to increase the voltage of the assembly the solar cells may be connected with one another in series by means of matching the negative poles of one of the supporting members with the positive poles of another supporting member.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

The single FIGURE of the drawing is a perspective view showing a toy model with solar collectors in accordance with the present invention.

DESCRIPTION OF A PREFERRED EMBODIMENT

As shown in the drawing, solar cells 1 are arranged on supporting members 2. Each of the supporting members 2 is provided with mechanical connecting means for connecting the same with other elements of a kit for assembling a toy model. The mechanical connecting means is formed as an undercut projection 3 which can be inserted into a corresponding undercut groove of the other structural elements of the toy model.

The above-mentioned other structure elements are identified by reference numerals 5, and further structural members can be connected thereto. As shown in the drawing, an axle 6 and a motor 7 are connected with the structural element 5 so as to form an essential part of the toy model. The supporting members 2 with the solar cells 1 together form in assembled condition a loading plate of the toy model.

The supporting members 2 are also provided with electrical connecting means for electrically connecting the solar cells 1 with one another. The electrical connecting means includes plugs 8 and sockets 9. When the plugs 8 of one supporting member 2 are inserted in the sockets 9 of another supporting member 2, the solar cells mounted on these supporting members become electrically connected with one another and simultaneously the supporting members 1 become mechanically connected with one another.

Each supporting member 2 is provided with two pairs of the electrical connecting elements each of which pairs is arranged on a side face of the supporting member. The side faces on which the electrical connecting elements are arranged may be located opposite to one another. Each supporting member 2 may be provided with two pairs of the plugs 8, with two pairs of sockets 9, or with one pair of the plugs 8 and one pair of the sockets 9.

One of the plugs 8 of each of the electrical connecting elements forms a negative pole, whereas another plug 8 of the same pair forms a positive pole. When the supporting members 2 are so connected that their identical poles match with one another, the solar cells mounted on the supporting member become connected in parallel with one another, whereby electric output of the assembly is increased. When the supporting members 2 are connected so that the positive poles of one of the supporting members match with the negative poles of another supporting member the solar cells mounted on these supporting members become connected with one another in series whereby the voltage of the assembly is increased.

In the construction illustrated in the drawing three groups of the solar cells 2 are shown, each of which groups includes four solar cells. The solar cells of each group are connected with one another in parallel, whereas the groups are additionally connected with one another in series by means of an electric conduit 10.

It will be understood that each of the elements described above, or two or more together, may also find a useful application in other types of constructions differing from the types described above.

While the invention has been illustrated and described as embodiment in a solar collector as a power source of a toy model, it is not intended to be limited to the details shown, since various modifications and structural changes may be made without departing in any way from the spirit of the present invention.

Without further analysis, the foregoing will so fully reveal the gist of the present invention that others can, by applying current knowledge readily adapt it for various applications without omitting features that from the standpoint of prior art, fairly constitute essential characteristics of the generic or specific aspects of this invention.

What is claimed as new and desired to be protected by Letters Patent is set forth in the appended claims:

1. In a toy model assembled from structural elements of a kit, comprising a solar collector having a supporting member; at least one solar cell mounted on said supporting member; electrical connecting means arranged on said supporting member for electrically connecting said at least one solar cell with other solar cells; and mechanical connecting means also arranged on said supporting member so as to connect the latter to another structural element of the toy model, so that said supporting member and said at least one solar cell together form an integral part of the toy model.

2. A toy model as defined in claim 1, wherein said supporting member is plate-like.

3. A toy model as defined in claim 1, wherein said electrical connecting means is arranged for electrically connecting said first-mentioned at least one solar cell in parallel with said other solar cells.

4. A toy model as defined in claim 3, wherein said electrical connecting means is arranged for electrically connecting said first-mentioned at least one solar cell also in series with said other solar cells.

5. A toy model as defined in claim 1, wherein said electrical connecting means is arranged for electrically connecting said first-mentioned at least one solar cell in series with said other solar cells.

6. A toy model as defined in claim 1, wherein said supporting member has two side faces, said electrical connecting means including two pairs of electrical connecting elements each arranged on a respective one of said side faces.

7. A toy model as defined in claim 6, wherein said electrical connecting elements are plugs.

8. A toy model as defined in claim 7, wherein one electrical connecting element of each of said pairs forms a positive pole, whereas the other electrical connecting element of the same pair forms a negative pole.

9. A toy model as defined in claim 6, wherein said electrical connecting elements are sockets.

10. A toy model as defined in claim 6, wherein the electrical connecting elements of one of said pairs are plugs whereas the electrical connecting elements of the other pair are sockets.

11. A toy model as defined in claim 6, wherein each of said other solar cells is mounted on a further such supporting member provided with further such electrical connecting elements, said electrical connecting elements of said first-mentioned supporting member being arranged for engaging said further electrical connecting elements of said further supporting member so as to not only electrically connect said first-mentioned at least one solar cell with a respective one of said other solar cells but to also mechanically connect said first-mentioned supporting member with said further supporting member.

12. A toy model as defined in claim 1, wherein said another structural element of the toy model has an undercut formation, said mechanical connecting means including a further undercut formation engageable with the undercut formation of said another structural element of the toy model.

13. A toy model as defined in claim 12, wherein one of said formations is an undercut groove whereas the other of said formations is an undercut projection engageable in said undercut groove.

14. A toy model as defined in claim 1, wherein said supporting member has two end faces and two side faces, said electrical connecting means including two pairs of electrical connecting elements each arranged on a respective one of said side faces, said mechanical connecting means including a mechanical connecting element arranged on one of said end faces.

15. A toy model as defined in claim 1, wherein each of said other solar cells is mounted on a further such supporting member provided with further such mechanical connecting means so as to connect said further supporting member with a structural element of the toy model.

16. A toy model as defined in claim 15, wherein said supporting members with said solar cells together form a loading plate of the toy model.

* * * * *